United States Patent
Yorozu et al.

(10) Patent No.: US 7,847,615 B2
(45) Date of Patent: Dec. 7, 2010

(54) QUANTUM BIT VARIABLE COUPLING METHOD, QUANTUM COMPUTING CIRCUIT USING THE METHOD, AND VARIABLE COUPLER

(75) Inventors: Shinichi Yorozu, Minato-ku (JP); Antti Olavi Niskanen, Sundsberg (FI)

(73) Assignees: NEC Corporation, Tokyo (JP); Japan Science and Technology Agency, Saitama (JP)

(*) Notice: Subject to any disclaimer, the term of this patent is extended or adjusted under 35 U.S.C. 154(b) by 48 days.

(21) Appl. No.: 12/439,970

(22) PCT Filed: Aug. 29, 2007

(86) PCT No.: PCT/JP2007/067240

§ 371 (c)(1),
(2), (4) Date: May 6, 2009

(87) PCT Pub. No.: WO2008/029815

PCT Pub. Date: Mar. 13, 2008

(65) Prior Publication Data

US 2010/0194466 A1    Aug. 5, 2010

(30) Foreign Application Priority Data

Sep. 5, 2006   (JP)   ............... 2006-239821

(51) Int. Cl.
    H03K 3/38    (2006.01)
(52) U.S. Cl. .................................................. 327/528
(58) Field of Classification Search ............. 327/527, 327/528
    See application file for complete search history.

(56) References Cited

U.S. PATENT DOCUMENTS 7,332,738 B2 *  2/2008  Blais et al. .................. 257/32

FOREIGN PATENT DOCUMENTS

| JP | 2000-068495 A | 3/2000 |
| JP | 2003-067181 A | 3/2003 |
| JP | 2005-302847 A | 10/2005 |
| JP | 2006-165812 A | 6/2006 |

OTHER PUBLICATIONS

J. E. Mooij, et al., "Josephson Persistent-Current Qubit," Science, Aug. 13, 1999, pp. 1036-1039, vol. 285.

J. B. Majer, et al., "Spectroscopy on Two Coupled Superconducting Flux Qubits," Physical Review Letters, Mar. 11, 2005, pp. 090501-1-090501-4, vol. 94.

M. Grajcar, et al., "Direct Josephson coupling between superconducting flux qubits," Physical Review B, 2005, pp. 020503-1-020503-4, vol. 72.

(Continued)

*Primary Examiner*—Jeffrey S Zweizig
(74) *Attorney, Agent, or Firm*—Sughrue Mion, PLLC

(57) ABSTRACT

In a quantum computing circuit forming a superconductive loop including a plurality of Josephson junctions, first and second superconductive magnetic flux quantum bit element (101, 102) are biased at a half-quantum magnetic flux, and have mutually different characteristic frequencies. A coupling superconductive magnetic flux quantum bit element element (103) is located between the first and second superconductive magnetic flux quantum bit elements (101, 102) to perform parametric variable control between the element (101, 102) by supplying a microwave magnetic field pulse which is equal to the frequency difference between the elements (101, 102).

7 Claims, 5 Drawing Sheets

OTHER PUBLICATIONS

Timur V. Filippov, et al., "Tunable Transformer for Qubits Based on Flux States," IEEE Transactions on Applied Superconductivity, Jun. 2003, pp. 1005-1008, vol. 13, No. 2.

C. Cosmelli, et al., "Controllable Flux Coupling for the Integration of Flux Qubits," arXiv:cond-mat/0403690v1, Mar. 29, 2004, pp. 1-10.

B. L. T. Plourde, et al., "Entangling flux qubits with a bipolar dynamic inductance," Physical Review B, 2004, pp. 140501-1-140501-4, vol. 70.

P. Bertet, et al., "Dephasing of a Superconducting Qubit Induced by a Photon Noise," Physical Review Letters, Dec. 16, 2005, pp. 257002-1-257002-4, vol. 95.

P. Bertet, et al., "Parametric coupling for superconducting qubits," Physical Review B, 2006, pp. 064512-1-064512-6, vol. 73.

* cited by examiner

US 7,847,615 B2

QUANTUM BIT VARIABLE COUPLING METHOD, QUANTUM COMPUTING CIRCUIT USING THE METHOD, AND VARIABLE COUPLER

TECHNICAL FIELD

The present invention relates to a quantum computing circuit applied to a quantum computer or a quantum relay which mainly includes Josephson junction systems.

BACKGROUND ART

In recent years, a quantum computer has been known as a computer based on a new concept involving the active use of fundamental principles of quantum mechanics, and can compute a certain specific question (such as prime factorization of large natural number) at an extremely high speed as compared with a current classical computer. Such a quantum computer uses a quantum two-level system which is called a quantum bit corresponding to a bit of the classical computer. Information handled by the quantum computer is input to a quantum bit element. The quantum bit element may be recognized, for example, as an atom having different quantum states, and hence two of the quantum states are used to store the information.

There are several candidates for the quantum two-level system, and among others, a solid element holds promise in view of quantum bit integration. In particular, a quantum bit element using a superconductive element has a significant lead over other solid elements because of, for example, its strong coherence.

An example of the superconductive quantum bit element for realizing quantum computation is a fundamental structure of a superconductive magnetic flux quantum bit element as illustrated in FIG. 2 (see Non-Patent Document 1). When an external magnetic flux close to a half-quantum magnetic flux is applied to a superconductive loop 201 having three Josephson junctions 202, the superconductive magnetic flux quantum bit element takes two specific states in which energy is minimum in a case where a persistent current circulating through the superconductive loop 201 is in a combination of two states, a clockwise state and a counterclockwise state. Thus, the illustrated superconductive magnetic flux quantum bit operates as an effective quantum two-level system, that is, a quantum bit.

Herein, it is to be noted that two-bit logical operation is essential so as to implement the quantum computation. Therefore, in order to realize the quantum computer, it is necessary to provide interaction between quantum bit elements by any method. When the quantum bit elements are integrated in the form of a quantum bit computing circuit (quantum computing circuit), it is necessary to introduce the interaction between the quantum bit elements and, thereby, to provide a computing gate operated by the condition between two quantum bit elements.

For example, a quantum bit computing circuit described in Non-Patent Document 1 has the superconductive magnetic flux quantum bit elements 301 and 302 coupled to each other (see Non-Patent Document 2). As illustrated in FIG. 3, the two superconductive magnetic flux quantum bit elements 301 and 302 partially share their loops and thereby magnetic coupling is established between the quantum bit elements.

As the coupling between the quantum bit elements, several examples are also proposed. Another one of the quantum bit computing circuits (see Non-Patent Document 3) is illustrated in FIG. 4. As shown in FIG. 4, a large Josephson junction 403 is provided in a loop common part of two superconductive magnetic flux quantum bit elements 401 and 402 to increase an inductance, thereby enhancing the interaction therebetween.

As illustrated in FIG. 5, Non-Patent Document 1 described earlier also discloses another quantum bit computing circuit in which a superconductive loop including a superconductive magnetic flux quantum interference device (SQUID) 504 is provided as a superconductive transformer 503 between superconductive magnetic flux quantum bit elements 501 and 502 to realize magnetic coupling between the superconductive magnetic flux quantum bit elements 501 and 502.

In a quantum bit computing circuit according to another technology related to this (see Non-Patent Document 4), as illustrated in FIG. 6, there is provided a superconductive transformer 603 in which two superconductive loops including superconductive magnetic flux quantum interference devices (SQUIDs) 604 are symmetrically coupled to each other to accomplish magnetic coupling between superconductive magnetic flux quantum bit elements 601 and 602. Further, in a quantum bit computing circuit according to another technology (see Non-Patent Document 5), as illustrated in FIG. 7, there is provided a superconductive transformer 703 in which a superconductive magnetic flux quantum interference device (SQUID) 704 is connected not in series but in parallel with a superconductive loop to realize magnetic coupling between the superconductive magnetic flux quantum bit elements 701 and 702.

In another quantum bit computing circuit (see Non-Patent Document 6), as illustrated in FIG. 8, a superconductive magnetic flux quantum interference device (SQUID) 803 which is current-biased is provided between superconductive magnetic flux quantum bit elements 801 and 802 to realize magnetic coupling between the superconductive magnetic flux quantum bit elements 801 and 802 through the superconductive magnetic flux quantum interference device (SQUID) 803.

In any of the quantum bit computing circuits, each of the quantum bit elements is required to maintain coherence for a long time. To be specific, it is known that the coherence of a quantum bit element greatly depends on a bias condition, and a long coherence time period is obtained just at an optimum operating point to which a half-quantum magnetic flux is applied (see Non-Patent Document 7).

Further, a quantum bit computing circuit similar to one of Non-Patent Document 6 is proposed also in Non-Patent Document 8. To describe more specifically, Non-Patent Document 8 discloses a quantum bit computing circuit in which a superconductive magnetic flux quantum interference device (SQUID) biased with a DC current is provided between two quantum bit elements having different characteristic frequencies in order to parametrically induce coupling between the two quantum bit elements. In this case, the superconductive magnetic flux quantum interference device (SQUID) is biased with a d.c. bias current selected in relation to a critical current. This structure can use a nonlinear inductance obtained when the superconductive magnetic flux quantum interference device (SQUID) is biased by d.c. current. The superconductive magnetic flux quantum interference device (SQUID) is given a microwave magnetic field pulse which has a frequency equal to a difference frequency between the respective characteristic frequencies of the two superconductive magnetic flux quantum bit elements, in order to induce coupling between the two quantum bit elements.

(Non-Patent Document 1)

"Josephson Persistent-Current Qubit" J. E. Mooij, T. P. Orlando, L. Levitov, L. Tian, C. H. van der Wal, and S. Lloyd, AUGUST 1999 VOL 285 SCIENCE p: 1036 (1999).

(Non-Patent Document 2)

"Spectroscopy on Two Coupled Superconducting Flux Qubits" J. B. Majer, F. G. Paauw, A. C. J. ter Haar, C. J. P. M. Harmans, and J. E. Mooij, PHYSICAL REVIEW LETTERS (PRL) 94, 090501 (2005).

(Non-Patent Document 3)

"Direct Josephson coupling between superconducting flux qubits" M. Grajcar, A. Izmalkov, S. H. W. van der Ploeg, S. Linzen, E. Il'ichev, Th. Wagner, U. Hubner, H.-G. Meyer, A. Maassen van den Brink, S. Uchaikin, and A. M. Zagoskin, PHYSICAL REVIEW B 72, 020503(R) 2005.

(Non-Patent Document 4)

"Tunable Transformer for Qubits Based on Flex States" T. V. Filippov, S. K. Tolpygo, J. Mannik, and J. E. Lukens, IEEE TRANSACTIONS ON APPLIED SUPERCONDUCTIVITY VOL. 13, NO. 2. JUNE p: 1005 (2003).

(Non-Patent Document 5)

"Controllable Flux Coupling for the Integration of Flux Qubits" C. Cosmelli, M. G. Castellano, F. Chiarello, R. Leoni, D. Simeone, G. Torrioli, P. Carelli, arXiv:cond-mat/0403690v1 29 Mar. 2004.

(Non-Patent Document 6)

"Entangling flux qubits with a bipolar dynamic inductance" B. L. T. Plourde, J. Zhang, K. B. Whaley, F. K. Wilhelm, T. L. Robertson, T. Hime, S. Linzen, P. A. Reichardt, C.-E. Wu, and J. Clarke, PHYSICAL REVIEW B 70, 140501(R) (2004).

(Non-Patent Document 7)

"Dephasing of a Superconducting Qubit Induced by Photon Noise" P. Bertet, I. Chiorescu, G. Burkard, K. Semba, C. J. P. M. Harmans, D. P. DiVincenzo, and J. E. Mooij, PHYSICAL REVIEW LETTERS (PRL) 95, 257002 (2005).

(Non-Patent Document 8)

"Parametric coupling for superconducting qubits" P. Bertet, C. J. P. M. Harmans, and J. E. Mooij, PHYSICAL REVIEW B 73, 064512 (2006).

DISCLOSURE OF THE INVENTION

Problems to be Solved by the Invention

The quantum bit computing circuits according to Non-Patent Documents 1 to 8 described above have several technical problems in the coupling between the quantum bit elements.

Specifically, in the cases of the quantum bit computing circuits according to Non-Patent Documents 2 and 3 as illustrated in FIGS. 3 and 4, a part of a superconductive loop or a Josephson junction is used as a coupling inductance. Therefore, there is a problem that a coupling inductance between the quantum bit elements (superconductive magnetic flux quantum bit elements) is not variable, and thus the interaction between the quantum bit elements is fixed and not variable (first problem).

With respect to Non-Patent Documents 1 and 5 disclosing the quantum bit computing circuits as illustrated in FIGS. 5 and 7, in Non-Patent Document 1, when the half-quantum magnetic flux is applied to the superconductive magnetic flux quantum interference device to turn off the interaction between the quantum bit elements, a critical current of the superconductive magnetic flux quantum interference device becomes 0, thereby switching the Josephson junction to an finite voltage state. Therefore, coherent magnetic coupling cannot be realized because of dissipation. As a result, the critical current of the superconductive magnetic flux quantum interference device becomes too small.

On the other hand, in Non-Patent Document 5, due to the fact that the superconductive magnetic flux quantum interference device is connected in parallel with the superconductive transformer loop, even when an internal magnetic flux of the superconductive magnetic flux quantum interference device is adjusted to change the inductance, a coupling inductance between the quantum bit elements cannot be completely adjusted to 0. Thus, in any of such cases, there is a problem that the coupling (interaction) between the quantum bit elements cannot be completely turned off (second problem).

In the case of the quantum bit computing circuit according to Non-Patent Document 4 as illustrated in FIG. 6, due to the geometrical arrangement of the superconductive magnetic flux quantum interference devices in the coupling superconductive transformer, the quantum bit elements per se are arranged in the special symmetrical structure in order to turn off the interaction. Thus, there is a problem that this can be applied to only a specific type of quantum bit element, that is, a superconductive magnetic flux quantum bit element (third problem).

In order to completely turn off the coupling (interaction) between the quantum bit elements, the quantum bit computing circuit according to Non-Patent Document 6 as illustrated in FIG. 8 utilizes a phenomenon that direct magnetic coupling between adjacent quantum bit elements and magnetic coupling therebetween through the superconductive magnetic flux quantum interference device sandwiched therebetween are canceled out. In view of this point, in order to utilize the direct magnetic coupling between the adjacently arranged quantum bit elements, it is necessary to reduce a distance between the quantum bit elements, with the result that a crosstalk between control signals cannot be suppressed. Therefore, there is a problem that a control current supplied to control a state of each of the quantum bit elements or to control the interaction between the quantum bit elements cannot be prevented from cross-coupling with another quantum bit element or superconductive magnetic flux quantum interference device (fourth problem).

When the technology according to Non-Patent Document 7 which is related to the quantum bit computing circuit as illustrated in FIG. 8 is introduced, due to a current supplied to the superconductive magnetic flux quantum interference device in order to control coupling (interaction), a change in current flowing thereinto causes changes in magnetic fluxes applied to the quantum bit elements located on both sides. Therefore, there is a problem that, when the coupling (interaction) between the quantum bit elements is to be controlled, bias points of the quantum bit elements are shifted to deviate operating points of the quantum bit elements from optimum conditions, thereby shortening coherence time periods of the quantum bit elements (fifth problem).

In the case where the technology according to Non-Patent Document 8 is introduced, when a current associated with the critical current is supplied to the superconductive magnetic flux quantum interference device (SQUID) to control coupling (interaction), a noise current entering the superconductive magnetic flux quantum interference device (SQUID)

flows asymmetrically through the right and left branches, and thus is magnetically coupled with the quantum bit elements to disturb coherence. Therefore, there is a problem that a noise entering from the outside through a control line for controlling the coupling (interaction) between the quantum bit elements is strongly coupled with the quantum bit elements, thereby degrading the coherence of the quantum bit elements (sixth problem).

The present invention seeks to solve the problems as described above. Specifically, the present invention seeks to provide a quantum bit coupling method of variably coupling quantum bit elements having different characteristic frequencies, a quantum computing circuit, and a variable coupler.

The present invention also seeks to provide a quantum bit variable coupling method of performing optimum variable control on an interaction of coupling between quantum bit elements while long coherence time periods are maintained, a quantum computing circuit using the same, and a variable coupler.

Means to Solve the Problems

The present invention provides a quantum bit variable coupling method of coupling a first quantum bit element and a second quantum bit element, including supplying a microwave pulse to a coupling quantum bit element and variably and parametrically controlling an interaction between the first quantum bit element and the second quantum bit element when the first quantum bit element and the second quantum bit element are coupled to each other through the coupling quantum bit element.

Also, in the quantum bit variable coupling method according to the present invention, in the controlling, coupling between the first quantum bit element and the second quantum bit element is turned on/off by the coupling quantum bit element.

Further, in the quantum bit variable coupling method according to the present invention, in the controlling, superconductive magnetic flux quantum bit elements which are biased at a half-quantum magnetic flux and have different characteristic frequencies are arranged adjacent to each other as the first quantum bit element and the second quantum bit element, and a coupling superconductive magnetic flux quantum bit element, which includes a predetermined number of Josephson junctions to form a superconductive loop, induces coupling between two of the superconductive magnetic flux quantum bit elements by supply of a microwave magnetic field pulse as the microwave pulse to turn on/off the coupling, and has a characteristic frequency different from the superconductive magnetic flux quantum bit elements, is used as the coupling quantum bit element.

The present invention also provides a quantum computing circuit including:

a first quantum bit element;

a second quantum bit element; and a coupling quantum bit element for coupling the first quantum bit element and the second quantum bit element and performing parametric variable control on an interaction of the coupling by supply of a microwave pulse.

In addition, in the quantum computing circuit according to the present invention:

the first quantum bit element and the second quantum bit element are formed by superconductive magnetic flux quantum bit elements which are arranged adjacent to each other and biased at a half-quantum magnetic flux and have different characteristic frequencies; and the coupling quantum bit element is formed by a coupling superconductive magnetic flux quantum bit element which includes a predetermined number of Josephson junctions to form a superconductive loop, induces coupling between two of the superconductive magnetic flux quantum bit elements by an application of a microwave magnetic field pulse as the microwave pulse to turn on/off the coupling, and has a characteristic frequency different from the superconductive magnetic flux quantum bit elements.

The present invention further provides a variable coupler for variably coupling a first quantum bit element and a second quantum bit element, including a coupling quantum bit element for coupling the first quantum bit element and the second quantum bit element and performing parametric variable control on an interaction of the coupling by supply of a microwave pulse. In the variable coupler, when the first quantum bit element and the second quantum bit element are superconductive magnetic flux quantum bit elements which are arranged adjacent to each other and biased at a half-quantum magnetic flux and have different characteristic frequencies, the coupling quantum bit element is preferably a coupling superconductive magnetic flux quantum bit element which includes a predetermined number of Josephson junctions to form a superconductive loop, induces coupling between two of the superconductive magnetic flux quantum bit elements by supply of a microwave magnetic field pulse as the microwave pulse to turn on/off the coupling, and has a characteristic frequency different from the superconductive magnetic flux quantum bit elements.

EFFECT OF THE INVENTION

In the quantum bit variable coupling method according to the present invention, the microwave pulse is supplied to the coupling quantum bit element to perform the parametric variable control on the interaction (to turn on/off coupling) when the first quantum bit element and the second quantum bit element which are arranged adjacent to each other are coupled to each other through the coupling quantum bit element (respective quantum bit elements have different characteristic frequencies from one another). Therefore, the variable control on the interaction of the coupling between the respective quantum bit elements can be optimally performed while long coherence time periods of the respective quantum bit elements are maintained. The quantum computing circuit using the quantum bit coupling method according to the present invention has the structure in which the variable coupler including the coupling quantum bit element (having predetermined number of Josephson junctions to form superconductive loop) is interposed between the first quantum bit element and the second quantum bit element, so the same effect is embodied. Thus, the fundamental characteristics and performance (reduction in size and weight, increased operating speed, reduction in power consumption, higher integration, and simpler structure) are improved, and reliability, productivity, and maintenance ability are improved more than in the conventional cases. Resource reusability is also effectively enhanced.

DESCRIPTION OF REFERENCE NUMERALS

Figure 1:
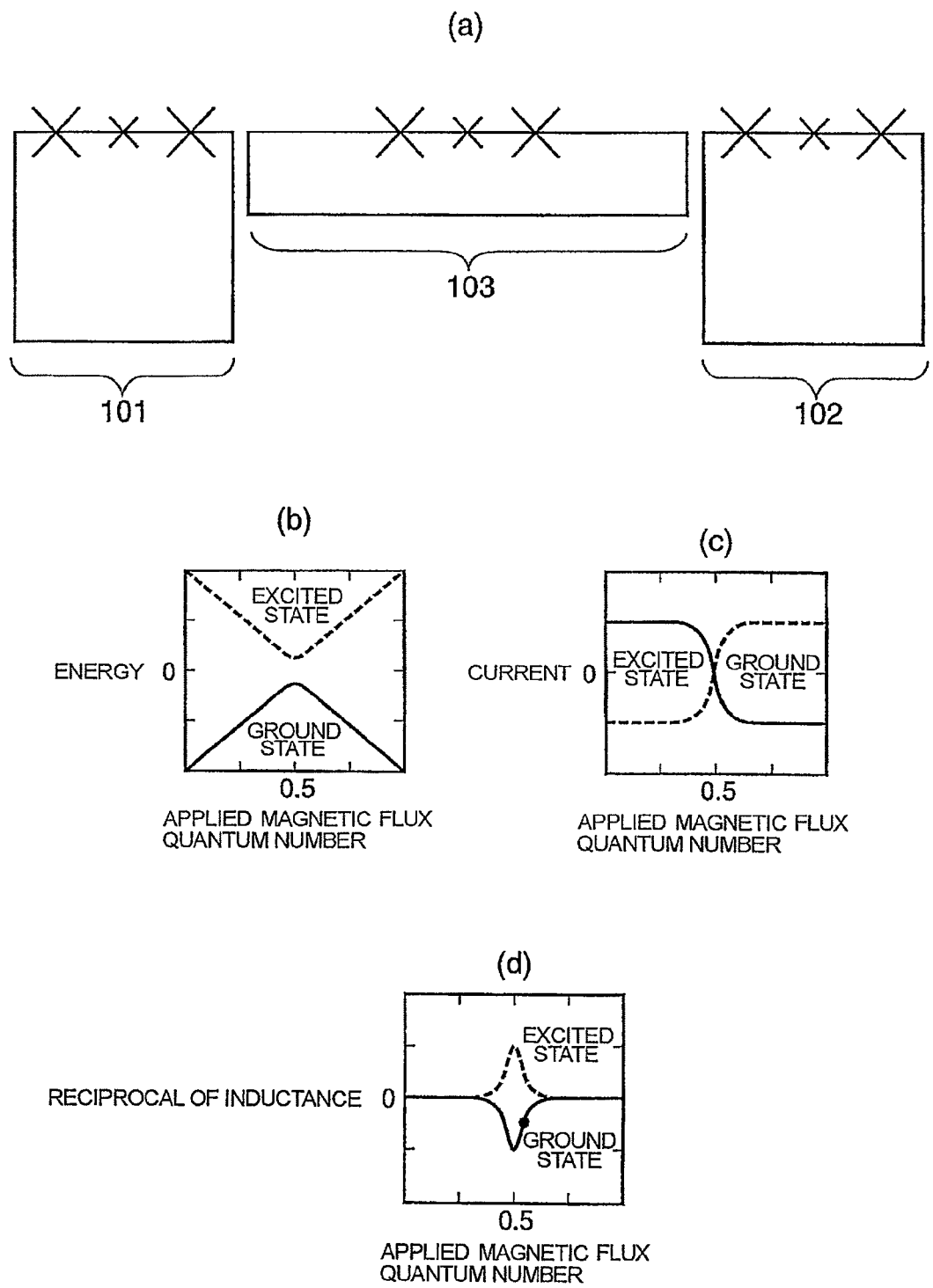
FIG. 1 is a diagram illustrating a fundamental structure and characteristics of a quantum computing circuit including a variable coupler according to an embodiment to which a quantum bit variable coupling method according to the present invention is applied, in which part (a) is a circuit diagram illustrating the fundamental structure thereof, part (b) illustrates an energy dependence characteristic of the variable coupler which is the principal part with respect to an applied magnetic flux quantum number, part (c) illustrates a circulating current (expected value) dependence characteristic of the variable coupler with respect to the applied magnetic flux quantum number, and part (d) illustrates an inductance dependence characteristic of the variable coupler with respect to the applied magnetic flux quantum number.
Figure 2:
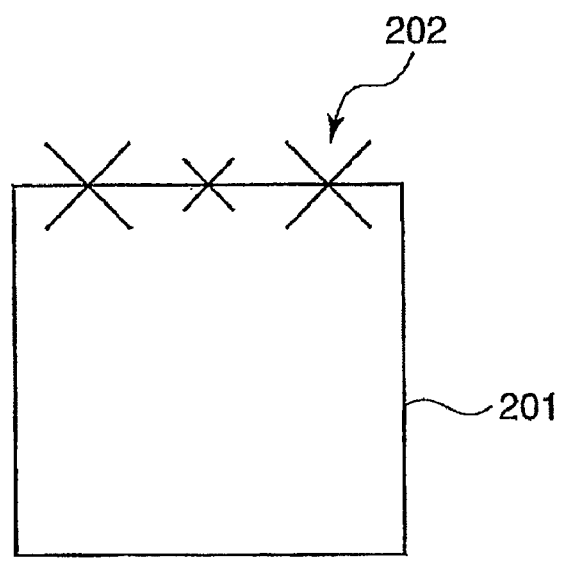
FIG. 2 is a schematic diagram illustrating a fundamental structure of a superconductive magnetic flux quantum bit element according to Non-Patent Document 1.
Figure 3:
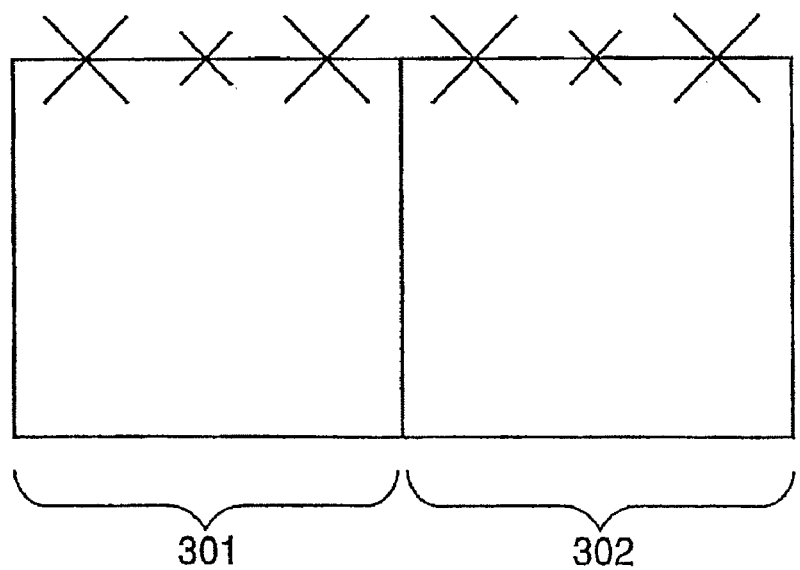
FIG. 3 is a schematic diagram illustrating a quantum bit computing circuit according to Non-Patent Document 2, in which the superconductive magnetic flux quantum bit elements illustrated in FIG. 2 are coupled to each other.
Figure 4:
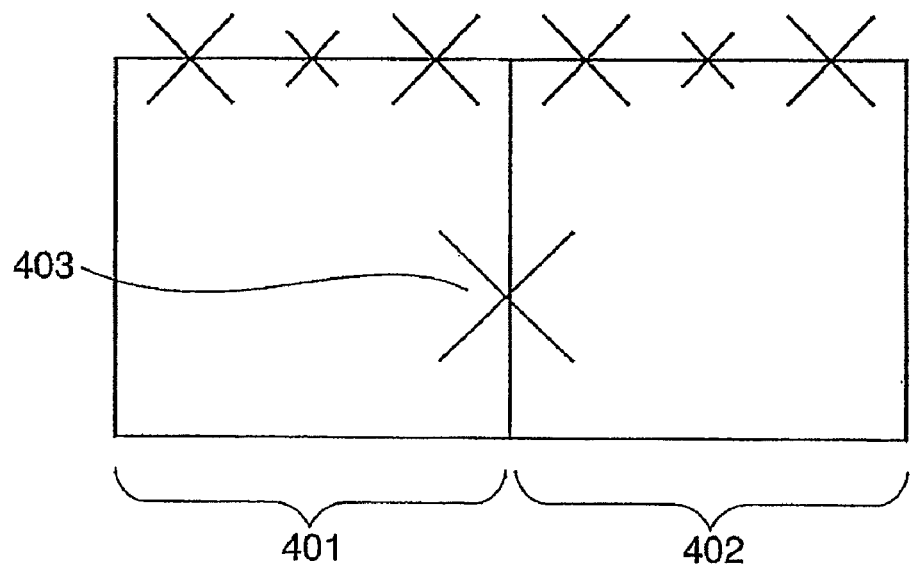
FIG. 4 is a schematic diagram illustrating a quantum bit computing circuit according to Non-Patent Document 3.
Figure 5:
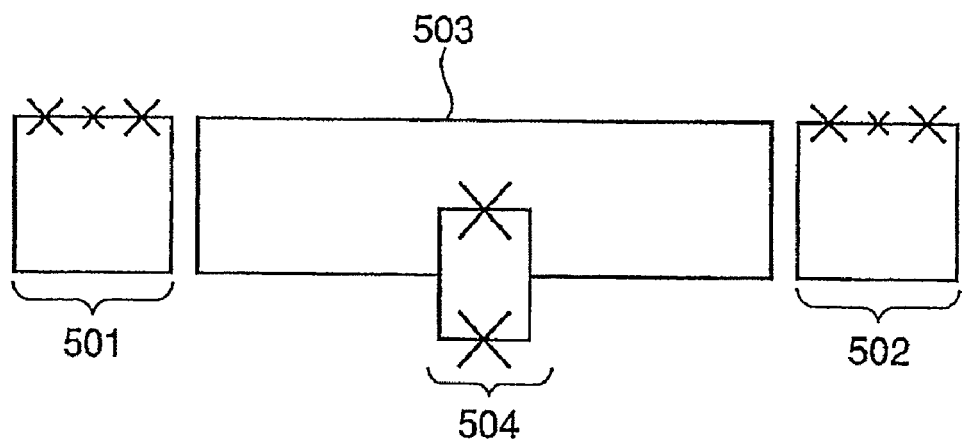
FIG. 5 is a schematic diagram illustrating a quantum bit computing circuit according to Non-Patent Document 1, in which the superconductive magnetic flux quantum bit elements illustrated in FIG. 2 are coupled to each other.
Figure 6:
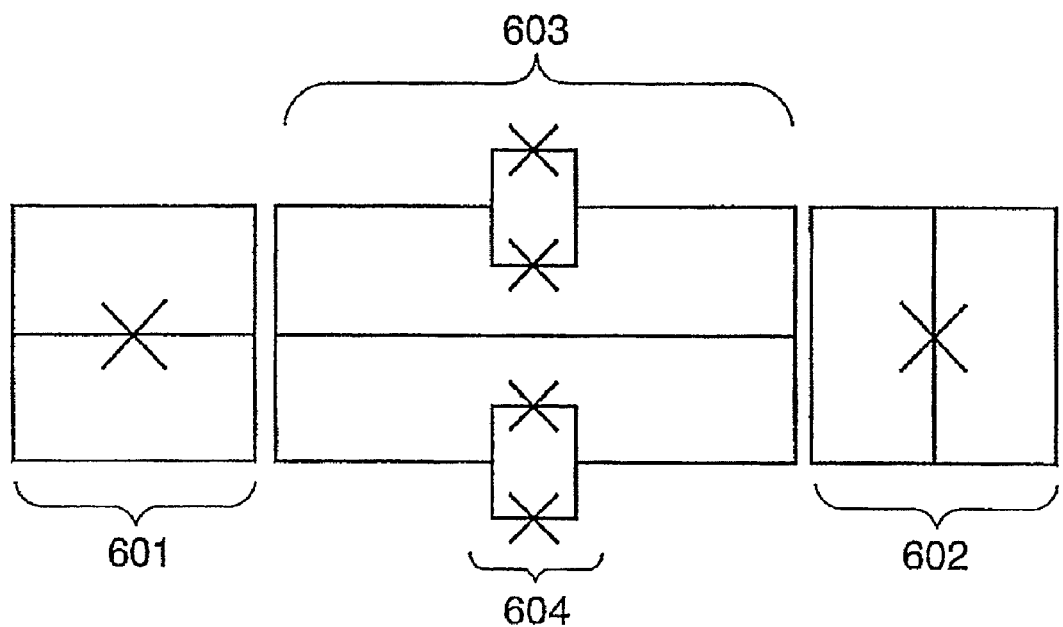
FIG. 6 is a schematic diagram illustrating a quantum bit computing circuit according to Non-Patent Document 4.
Figure 7:
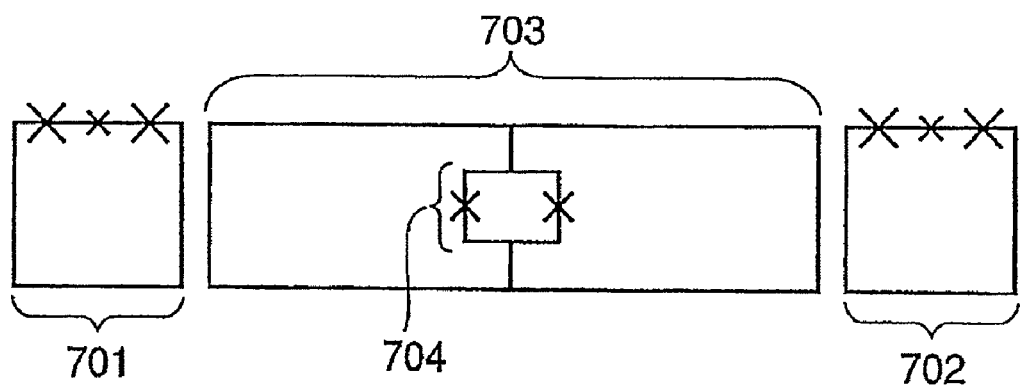
FIG. 7 is a schematic diagram illustrating a quantum bit computing circuit according to Non-Patent Document 5.
Figure 8:
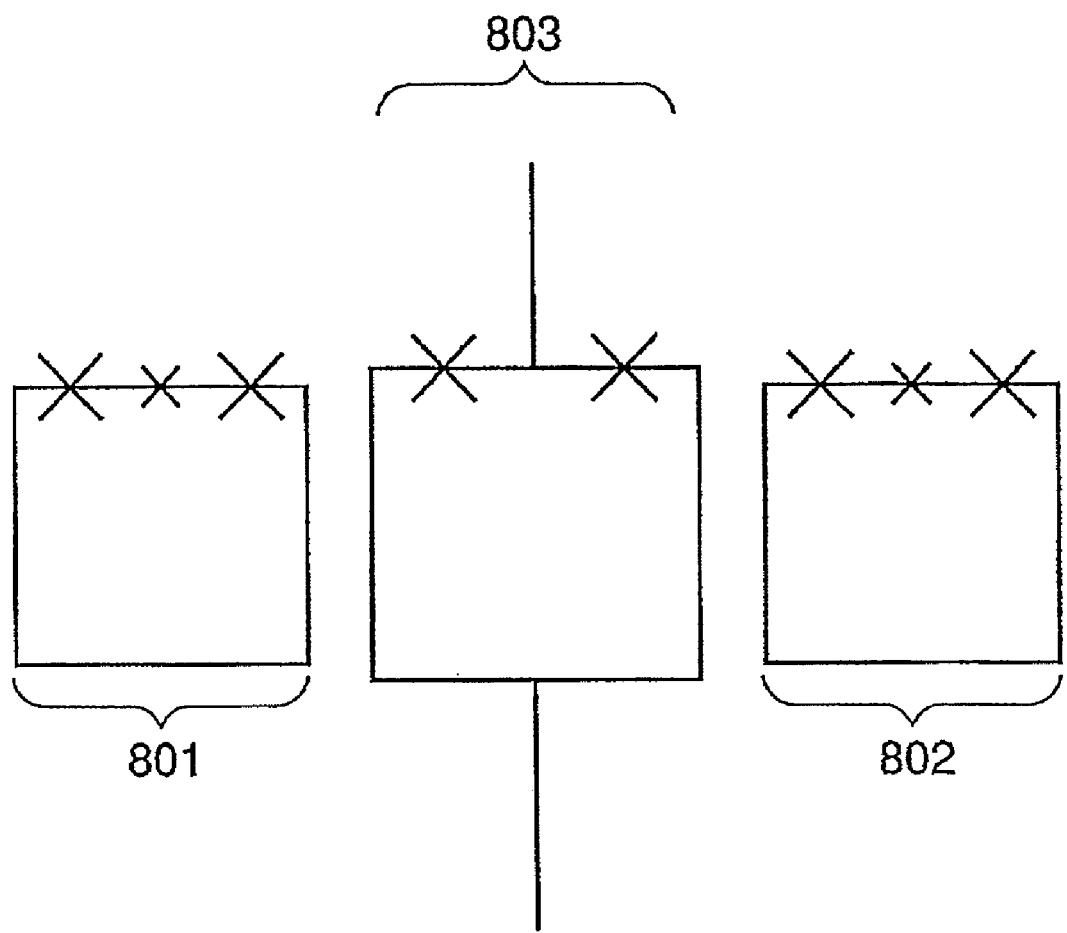
FIG. 8 is a schematic diagram illustrating a quantum bit computing circuit according to Non-Patent Document 6.

101, 102, 301, 302, 401, 402, 501, 502, 601, 602, 701, 702, 801, 802 superconductive magnetic flux quantum bit element
103 coupling superconductive magnetic flux quantum bit element
201 superconductive loop
202 Josephson junction
403 coupling Josephson junction
503, 603, 703 superconductive transformer
504, 604, 704 superconductive magnetic flux quantum interference device (SQUID)
803 coupling superconductive magnetic flux quantum interference device (SQUID)

BEST MODE FOR EMBODYING THE INVENTION

Description is made about the principles of a quantum bit coupling method according to the present invention In a case where a first quantum bit element and a second quantum bit element are coupled to each other, the method includes a control stage for applying a microwave pulse to a coupling quantum bit element to perform parametric variable control on an interaction when the first quantum bit element and the second quantum bit element are coupled to each other through the coupling quantum bit element. In this control stage, the coupling between the first quantum bit element and the second quantum bit element is turned on/off by the coupling quantum bit element.

That is, a feature of the present invention resides in that the coupling quantum bit element is provided to perform parametric variable control between the first and second quantum bit elements without causing any d.c. current to flow.

The first quantum bit element and the second quantum bit element are formed of superconductive magnetic flux quantum bit elements which have characteristic frequencies different from each other and are arranged adjacent to each other. The first and second quantum bit elements each include a predetermined number of Josephson junctions and are biased at a half-quantum magnetic flux.

On the other hand, the coupling quantum bit element includes a predetermined number of Josephson junctions, forms a superconductive loop, and has a characteristic frequency different from those of the first and second quantum bit elements. The coupling quantum bit element is supplied with a microwave magnetic field pulse as a microwave pulse to turn on/off the coupling between the first and second quantum bit elements. Therefore, the two superconductive magnetic flux quantum bit elements are coupled to each other. In this case, a frequency of the microwave magnetic field pulse applied to the coupling quantum bit element is desirably a frequency equal to a difference between the characteristic frequencies of the first and second quantum bit elements.

Hereinafter, the superconductive magnetic flux quantum bit variable coupling method is more specifically described. The first superconductive magnetic flux quantum bit element and the second superconductive magnetic flux quantum bit element are biased at the half-quantum magnetic flux which is an optimum bias point for maintaining coherence by a static magnetic field applied from the outside. A one-bit state is controlled by applying microwave magnetic field pulses resonating at respective characteristic frequencies $\Delta 1$ and $\Delta 2$ of the first superconductive magnetic flux quantum bit element and the second superconductive magnetic flux quantum bit element. The characteristic frequencies $\Delta 1$ and $\Delta 2$ of the first superconductive magnetic flux quantum bit element and the second superconductive magnetic flux quantum bit element which are arranged adjacent to each other are detuned relative to each other. A characteristic frequency $\Delta 3$ of the coupling superconductive magnetic flux quantum bit element provided between the first superconductive magnetic flux quantum bit element and the second superconductive magnetic flux quantum bit element is also significantly detuned from the characteristic frequencies $\Delta 1$ and $\Delta 2$. The coupling superconductive magnetic flux quantum bit element is constantly in a ground state sufficiently larger than thermal energy corresponding to an environmental temperature, and biased at a magnetic flux slightly shifted from the half-quantum magnetic flux. Therefore, unlike the superconductive magnetic flux quantum interference device (SQUID) described in Non-Patent Documents 6 and 8, the coupling superconductive magnetic flux quantum bit element is not direct-current biased with the bias current.

Hereinafter, description is made about a fundamental operation in a case where the first superconductive magnetic flux quantum bit element and the second superconductive magnetic flux quantum bit element which have the different characteristic frequencies are coupled to each other through the coupling superconductive magnetic flux quantum bit element. Magnetic coupling is present between the first superconductive magnetic flux quantum bit element and the second superconductive magnetic flux quantum bit element even in a state in which no microwave magnetic field pulse is applied from the outside. In such a case, however, a frequency difference $|\Delta 1 - \Delta 2|$ indicates detuning larger than a coupling strength. Therefore, no energy is exchanged between the first superconductive magnetic flux quantum bit element and the second superconductive magnetic flux quantum bit element, and hence the interaction of the coupling between the first superconductive magnetic flux quantum bit element and the second superconductive magnetic flux quantum bit element (quantum bit elements) is effectively turned off. The bias current is not supplied to the coupling superconductive magnetic flux quantum bit element, whereby the adverse effect such as the entrance of a noise current caused by the bias current is not generated.

In order to turn on the coupling between the first superconductive magnetic flux quantum bit element and the second superconductive magnetic flux quantum bit element (quantum bit elements), a microwave magnetic field pulse of the frequency difference |Δ1−Δ2| is desirably supplied to the coupling superconductive magnetic flux quantum bit element. At this time, an inductance of the coupling superconductive magnetic flux quantum bit element is a function of magnetic flux and oscillates with the applied microwave magnetic field pulse, whereby the coupling between the first superconductive magnetic flux quantum bit element and the second superconductive magnetic flux quantum bit element is parametrically induced in proportion to the strength of the microwave magnetic pulse.

Hereinafter, with reference to the attached drawings, a quantum computing circuit including a variable coupler to which the quantum bit variable coupling method according to the present invention is applied is described in detail by way of an embodiment.

Embodiment

FIG. 1 is a diagram illustrating a fundamental structure and characteristics of the quantum computing circuit including the variable coupler according to the embodiment using the quantum bit variable coupling method according to the present invention. More specifically, FIG. 1(a) is a circuit diagram illustrating the fundamental structure thereof, FIG. 1(b) illustrates an energy dependence characteristic of the variable coupler which is the principal part with respect to a supplied magnetic flux quantum number, FIG. 1(c) illustrates a circulating current (expected value) dependence characteristic of the variable coupler with respect to the supplied magnetic flux quantum number, and FIG. 1(d) illustrates an inductance dependence characteristic of the variable coupler with respect to the supplied magnetic flux quantum number.

Now, the quantum computing circuit includes a first superconductive magnetic flux quantum bit element 101 and a second superconductive magnetic flux quantum bit element 102 which are arranged adjacent to each other, each of which has a predetermined number of (three in this embodiment) Josephson junctions and forms a superconductive loop. A coupling superconductive magnetic flux quantum bit element 103 is also provided between the first and second superconductive magnetic flux quantum bit elements 101 and 102.

As the first and second superconductive magnetic flux quantum bit elements 101 and 102, the illustrated coupling superconductive magnetic flux quantum bit element 103 has a predetermined number of (three in this embodiment) Josephson junctions and forms a superconductive loop. The coupling superconductive magnetic flux quantum bit element 103 serves as a variable coupler (superconductive transformer) for coupling the first superconductive magnetic flux quantum bit element 101 and the second superconductive magnetic flux quantum bit element 102. In addition, the coupling superconductive magnetic flux quantum bit element 103 serves to perform parametric variable control on an interaction of the coupling by supply of a microwave pulse.

To describe more specifically, the first superconductive magnetic flux quantum bit element 101 and the second superconductive magnetic flux quantum bit element 102 have the different characteristic frequencies from each other (Δ1 and Δ2 in this embodiment) and are biased at the half-quantum magnetic flux. In contrast to this, the coupling superconductive magnetic flux quantum bit element 103 has the characteristic frequency (expressed by Δ3 in this embodiment) different from those of the first and second superconductive magnetic flux quantum bit elements 101 and 102 and can turn on/off the coupling between the first and second superconductive magnetic flux quantum bit elements 101 and 102 by the supply of a microwave magnetic field pulse as the microwave pulse. In this embodiment, the microwave magnetic field pulse equal to a frequency difference between the first superconductive magnetic flux quantum bit element 101 and the second superconductive magnetic flux quantum bit element 102 is supplied to the coupling superconductive magnetic flux quantum bit element 103 to induce the coupling between the first superconductive magnetic flux quantum bit element 101 and the second superconductive magnetic flux quantum bit element 102.

In the case of the quantum computing circuit illustrated in FIG. 1(a), the first superconductive magnetic flux quantum bit element 101 is an quantum bit from which information is to be read, the second superconductive magnetic flux quantum bit element 102 is a read circuit, and the coupling superconductive magnetic flux quantum bit element 103 is provided therebetween.

All electrical circuits of the respective quantum bit elements 101 to 103 are formed on an insulating board (not shown) having small loss in a high frequency range. Examples of a board material may include sapphire, magnesium oxide, and silicon formed with a thermal oxide film. Each of wirings for electrical circuits is a superconductive wiring, and hence heat generated by a flowing current is 0. Examples of a superconductive material can include aluminum, niobium, and niobium nitride.

As described above, both the two superconductive magnetic flux quantum bit elements 101 and 102 each form the superconductive loop including the three Josephson junctions. One of the three Josephson junctions (which is located at central portion) is slightly smaller than the other adjacent two. The characteristic frequencies Δ1 and Δ2 of the superconductive magnetic flux quantum bit elements 101 and 102 are designed to be rendered equal to a use frequency of approximately 5 GHz. The difference frequency (detuning |Δ1−Δ2|) between the superconductive magnetic flux quantum bit elements 101 and 102 is designed to be approximately 1 GHz. The superconductive magnetic flux quantum bit elements 101 and 102 are biased at the optimum bias point for maintaining coherence by the static magnetic field supplied from the outside, that is, at the half-quantum magnetic flux as described above.

The coupling superconductive magnetic flux quantum bit element 103 is designed to have the characteristic frequency Δ3 set to approximately 15 GHz to be significantly different from the characteristic frequencies Δ1 and Δ2 of the superconductive magnetic flux quantum bit elements 101 and 102, and to be constantly in a ground state sufficiently larger than thermal energy corresponding to an environmental temperature of 10 mK, and is biased at a magnetic flux slightly deviated from the half-quantum magnetic flux.

In the coupling superconductive magnetic flux quantum bit element 103 which is the variable coupler, as is apparent from any of the characteristic of the dependence of energy on supplied magnetic flux quantum number as illustrated in FIG. 1(b) (dependence of energy on magnetic flux), the characteristic of the dependence of circulating current (expected value) on supplied magnetic flux quantum number as illustrated in FIG. 1(c) (which is obtained by differentiation with respect to the magnetic flux and expressed as expected value of circulating current), and the characteristic of the dependence of inductance on supplied magnetic flux quantum number as illustrated in FIG. 1(d) (which is obtained by further differentiation with respect to magnetic flux, in which reciprocal 1/LQ of self-inductance LQ is expressed as function of magnetic flux). In each waveform of FIGS. 1(b) to (d), the ground state exhibits a symmetrical shape in which a physical quantity or electrical numerical value in the ordinate increases or decreases in accordance with an increase in applied magnetic flux quantum number in the abscissa, in contrast to an excited state. Note that the superconductive magnetic flux quantum bit elements 101 and 102 also have the same characteristics.

An effective mutual inductance $L_{eff}$ between the superconductive magnetic flux quantum bit elements 101 and 102 is considered. When a mutual inductance between the superconductive magnetic flux quantum bit elements 101 and 102 is expressed by $M_{12}$, a mutual inductance between the superconductive magnetic flux quantum bit element 101 and the coupling superconductive magnetic flux quantum bit element 103 is expressed by $M_{13}$, and a mutual inductance between the superconductive magnetic flux quantum bit element 102 and the coupling superconductive magnetic flux quantum bit element 103 is expressed by $M_{23}$, $L_{eff}$ is expressed by a relational expression of $L_{eff}=M_{12}-M_{13}M_{23}/LQ$, and hence it is apparent that $L_{eff}$ is a function of a magnetic flux passing through the coupling superconductive magnetic flux quantum bit element 103 through the dependence of LQ on magnetic flux.

The case is examined, in which a magnetic flux bias of the coupling superconductive magnetic flux quantum bit element 103 is set to a point in which a change in effective mutual inductance is largest as indicated by a black circle mark in the ground state illustrated in FIG. 1(d). In such a case, even when no microwave magnetic field pulse is supplied from the outside, magnetic coupling is produced between the superconductive magnetic flux quantum bit elements 101 and 102. However, the superconductive magnetic flux quantum bit elements 101 and 102 are biased at optimum operating points in which expected values of superconductive currents circulating them are 0 and are maintained at the difference frequency (detuning $|\Delta 1-\Delta 2|$) larger than a strength of the magnetic coupling, whereby no energy is exchanged between the superconductive magnetic flux quantum bit elements 101 and 102. Therefore, the interaction of the coupling between the superconductive magnetic flux quantum bit elements 101 and 102 is effectively turned off.

In order to turn on the interaction of the coupling between the superconductive magnetic flux quantum bit elements 101 and 102, the microwave magnetic field pulse of the difference frequency (detuning $|\Delta 1-\Delta 2|$) is desirably supplied to the coupling superconductive magnetic flux quantum bit element 103. In such a case, an inductance of the coupling superconductive magnetic flux quantum bit element 103 is a function of magnetic flux and the function of magnetic flux oscillatingly changes with the microwave magnetic field pulse. Therefore, the coupling between the superconductive magnetic flux quantum bit elements 101 and 102 is induced in a parametric way in proportion to the strength of the microwave magnetic field pulse.

In the case of the quantum computing circuit as described above, the interaction of the coupling between the adjacently arranged superconductive magnetic flux quantum bit elements 101 and 102 can be variably controlled through the coupling superconductive magnetic flux quantum bit element 103. Therefore, the conventional first problem that the interaction between the quantum bit elements is held and not variable is solved.

In the case of the quantum computing circuit, the superconductive magnetic flux quantum bit elements 101 and 102 to be used are designed to have the significantly different characteristic frequencies and biased at the half-quantum magnetic flux, whereby static magnetic coupling can be neglected. Further, in the off state in which no microwave magnetic field pulse is supplied, the interaction of the coupling between the superconductive magnetic flux quantum bit elements 101 and 102 can be completely turned off. Therefore, the conventional second problem that the coupling (interaction) between the quantum bit elements cannot be completely turned off is solved.

In the case of the quantum computing circuit, the coupling (interaction) is induced in the parametric way using the microwave magnetic field pulse. Therefore, when the coupling (interaction) between the superconductive magnetic flux quantum bit elements 101 and 102 is controlled, the bias points of the respective quantum bit elements 101 to 103 are not shifted (this is remarkable particularly in the coupling superconductive magnetic flux quantum bit element 103) and the operating points of the quantum bit elements 101 to 103 are not deviated from the optimum conditions, whereby the coherence time periods of the respective quantum bit elements (in particular, superconductive magnetic flux quantum bit elements 101 and 102) can be lengthened. Thus, the conventional fifth problem that the operating points of the quantum bit elements are deviated from the optimum conditions to shorten the coherence time periods of the quantum bit elements is solved.

In the case of the quantum computing circuit, the coupling superconductive magnetic flux quantum bit element 103 serving as the superconductive transformer, which is arranged adjacent to the superconductive magnetic flux quantum bit elements 101 and 102 to couple therebetween, is used without using direct magnetic coupling between the superconductive magnetic flux quantum bit elements 101 and 102. Therefore, a distance between the superconductive magnetic flux quantum bit elements 101 and 102 can be set to a sufficiently large value to suppress a cross talk between signals for quantum bit control. Thus, the conventional fourth problem that the control current supplied to control the states of the quantum bit elements or to control the interaction between the quantum bit elements cannot be prevented from cross-coupling with another quantum bit element is solved.

In the case of the quantum computing circuit, their own symmetry of the superconductive magnetic flux quantum bit elements 101 and 102 is not used to turn off the coupling (interaction) between the superconductive magnetic flux quantum bit elements 101 and 102. Therefore, there is small limitation on a type of a used quantum bit element and an arrangement thereof. Thus, the conventional third problem that there is a limitation in a case where the quantum bit elements are arranged in the special symmetrical structure in order to turn off the coupling (interaction) (this can be applied only to the superconductive magnetic flux quantum bit element) is solved.

In the case of the quantum computing circuit, the bias condition of the coupling superconductive magnetic flux quantum bit element 103 is optimized. Therefore, a fluctuation of a magnetic flux in the coupling superconductive magnetic flux quantum bit element 103 can be prevented from affecting the coherence of the superconductive magnetic flux quantum bit elements 101 and 102 to prevent additional decoherence. Thus, the conventional sixth problem is solved in that the noise current flows asymmetrically through the right and left branches to be magnetically coupled with the quantum bit elements, thereby disturbing coherence, and thus the noise entering from the outside through the control line for controlling the coupling (interaction) between the quantum bit elements is strongly coupled with the quantum bit elements to degrade the coherence of the quantum bit elements.

In the quantum computing circuit according to the embodiment, the simple structure including the two superconductive magnetic flux quantum bit elements 101 and 102 and the coupling superconductive magnetic flux quantum bit element 103 is described. In a modified example, when a pattern is repeatedly formed in which a superconductive loop (superconductive transformer) identical to the coupling superconductive magnetic flux quantum bit element 103 is provided around the superconductive magnetic flux quantum bit element 102 and a superconductive loop identical to the superconductive magnetic flux quantum bit element 102 is provided therearound, an extended structure having n quantum bits (multi-bits) can be easily obtained. In addition, when a superconductive loop identical to the coupling superconductive magnetic flux quantum bit element 103 and a read circuit (superconductive loop) having the same circuit structure as the superconductive magnetic flux quantum bit element 102 are provided in order to read certain quantum bit information, it is also possible to realize a read stabilization function in which the influence of the read circuit on the quantum bit is suppressed. Thus, the quantum computing circuit according to the present invention is not limited to the structures described in the embodiment.

INDUSTRIAL APPLICABILITY

The present invention can be applied to a quantum computing circuit used for a quantum computer or a quantum relay.

This application claims priority from Japanese Patent Application No. 2006-239821 filed on Sep. 5, 2006, all the content of which is hereby incorporated into this application.

The invention claimed is:

1. A quantum bit variable coupling method of coupling a first quantum bit element and a second quantum bit element, comprising:
   supplying a microwave pulse to a coupling quantum bit element; and
   variably and parametrically controlling an interaction between the first quantum bit element and the second quantum bit element when the first quantum bit element and the second quantum bit element are coupled to each other through the coupling quantum bit element.

2. A quantum bit variable coupling method according to claim 1, wherein the controlling is performed by the coupling quantum bit element by turning coupling on/off between the first quantum bit element and the second quantum bit element.

3. A quantum bit variable coupling method according to claim 2, wherein, in the controlling, the first quantum bit element and the second quantum bit element are formed by superconductive magnetic flux quantum bit elements of different characteristic frequencies, the first quantum bit element and the second quantum bit element being arranged adjacent to each other and being biased at a half-quantum magnetic flux while the coupling quantum bit element is formed by a coupling superconductive magnetic flux quantum bit element which includes a predetermined number of Josephson junctions, forms a superconductive loop, induces coupling between two of the superconductive magnetic flux quantum bit elements by supply of a microwave magnetic field pulse as the microwave pulse to turn on/off the coupling, and has a characteristic frequency different from the superconductive magnetic flux quantum bit elements.

4. A quantum computing circuit, comprising:
   a first quantum bit element;
   a second quantum bit element; and
   a coupling quantum bit element for coupling the first quantum bit element and the second quantum bit element and performing parametric variable control on an interaction of the coupling by supply of a microwave pulse.

5. A quantum computing circuit according to claim 4, wherein:
   the first quantum bit element and the second quantum bit element are formed by superconductive magnetic flux quantum bit elements which are arranged adjacent to each other and biased at a half-quantum magnetic flux and have different characteristic frequencies; and
   the coupling quantum bit element is formed by a coupling superconductive magnetic flux quantum bit element which includes a predetermined number of Josephson junctions to form a superconductive loop, induces coupling between two of the superconductive magnetic flux quantum bit elements by supply of a microwave magnetic field pulse as the microwave pulse to turn on/off the coupling, and has a characteristic frequency different from the superconductive magnetic flux quantum bit elements.

6. A variable coupler for variably coupling a first quantum bit element and a second quantum bit element, comprising a coupling quantum bit element for coupling the first quantum bit element and the second quantum bit element and performing parametric variable control on an interaction of the coupling by supply of a microwave pulse.

7. A variable coupler according to claim 6, wherein, when the first quantum bit element and the second quantum bit element are formed by superconductive magnetic flux quantum bit elements which are arranged adjacent to each other and biased at a half-quantum magnetic flux and have different characteristic frequencies while the coupling quantum bit element is formed by a coupling superconductive magnetic flux quantum bit element which includes a predetermined number of Josephson junctions to form a superconductive loop, induces coupling between two of the superconductive magnetic flux quantum bit elements by supply of a microwave magnetic field pulse as the microwave pulse to turn on/off the coupling, and has a characteristic frequency different from the superconductive magnetic flux quantum bit elements.

* * * * *